United States Patent

Hayashida et al.

[11] Patent Number: 5,804,257
[45] Date of Patent: Sep. 8, 1998

[54] POLYSILANE COMPOSITIONS

[75] Inventors: Akira Hayashida, Higashimurayama; Shigeru Mori; Eiichi Tabei, both of Kawasaki, all of Japan

[73] Assignee: Shin-Etsu Chemical Co., Ltd., Tokyo, Japan

[21] Appl. No.: 466,278

[22] Filed: Jun. 6, 1995

Related U.S. Application Data

[62] Division of Ser. No. 132,344, Oct. 6, 1993, abandoned.

[30] Foreign Application Priority Data

Oct. 9, 1992 [JP] Japan .................................. 4-298101
Feb. 4, 1993 [JP] Japan .................................. 5-40405
May 12, 1993 [JP] Japan .................................. 5-134054

[51] Int. Cl.⁶ .............................. C08K 5/101; B05D 3/06
[52] U.S. Cl. ........................ 427/558; 522/68; 522/148; 524/297; 524/299; 524/311; 524/314; 524/588
[58] Field of Search .................................. 524/297, 299, 524/311, 314, 588; 522/148, 68; 427/558, 515, 517, 572, 574

[56] References Cited

U.S. PATENT DOCUMENTS

| | | | |
|---|---|---|---|
| 4,975,480 | 12/1990 | Bullen | 524/714 |
| 5,093,389 | 3/1992 | Shimizu . | |
| 5,180,771 | 1/1993 | Arai et al. . | |
| 5,273,706 | 12/1993 | Laughner . | |
| 5,304,622 | 4/1994 | Ikai et al. . | |
| 5,372,908 | 12/1994 | Hayase et al. | 522/68 |

FOREIGN PATENT DOCUMENTS

| | | | |
|---|---|---|---|
| 4-155344 | 5/1992 | Japan | 522/148 |

*Primary Examiner*—Veronica P. Hoke
*Attorney, Agent, or Firm*—Birch, Stewart, Kolasch & Birch, LLP

[57] ABSTRACT

A polysilane composition including a polysilane and a plasticizer can be coated as a thin film having improved mechanical strength and a high photo decomposition rate. A polysilane composition including a polysilane and an ester can be coated as a thin film which is exposed to UV and readily dyed to form a dyed polysilane film.

15 Claims, 8 Drawing Sheets

POLYSILANE COMPOSITIONS

This application is a divisional of application Ser. No. 08/131,344, filed on Oct. 6, 1993, now abandoned, the entire contents of which are hereby incorporated by reference.

BACKGROUND OF THE INVENTION

1. Field of the Invention

This invention relates to a polysilane composition, and more particularly, to a polysilane composition which is shapable into a product having improved mechanical properties, especially strength and brittleness, easy to handle, and well photo-decomposable and finds use in a wide variety of applications. It also relates to a dyeable polysilane composition and a method for preparing a dyed polysilane film, and more particularly, to a dyeable polysilane composition which forms a dyed polysilane film suitable for use as a color filter in optical and lighting apparatus and a method for preparing such a dyed polysilane film.

2. Prior Art

In the recent years, polysilanes have drawn great attention as ceramic precursors and optical functional materials. However, since polysilanes are hard brittle materials, they are undesirably liable to cracking or rupture even by slight distortion. They are thus cumbersome to handle and difficult to utilize in various applications, all forming a bar against practical use.

For overcoming these drawbacks, attempts have been made for improving the strength of polysilanes through crosslinking (see West, R. et al, J. Organomet. Chem., 1986, 300, 327; Qiu, H. et al, J. Polym. Sci., Polym. Chem. Ed., 1989, 27, 2849; and Japanese Patent Application No. 246548/1991) and for forming copolymers of polysilanes with olefinic monomers (see Sakamoto, K., Sakurai, H., J. Am. Chem. Soc., 1989, 111, 7641). These attempts involving reaction use expensive reactants and reaction apparatus and thus result in increased costs while they are still unsuccessful in improving the brittleness of shaped products to a satisfactory level.

There is a desire for an advantageous solution for increasing the strength and improving the brittleness of shaped polysilane products.

On the other hand, polysilanes as optical functional material, especially high molecular weight polysilanes are photo-decomposable into lower molecular weight ones upon exposure to light in the ultraviolet region and thus find use in lithography by taking advantage of this photo-decomposition process. Polysilanes in a solution state have a high quantum efficiency of photo decomposition which is approximate to 1, but in a solid state have a significantly low quantum efficiency of 0.01 to 0.02. Then solid polysilanes require a large quantity of light to decompose at the sacrifice of economy and are prevented from practical use.

To solve this problem, attempts have been made to add various additives for increasing the decomposition rate. There are added readily reducible aromatic compounds, for example, 1,4-bis-trichloromethylbenzene and 2,4,6-tris-trichloromethyltriazine (see Miller, R. D., West, R., et al., ACS, Symp. Ser., 266 (Mater. Microlithogr.), 1984, 293) and phthalimide trifurates (see Wallraff, G. M., Miller, R. D., J. Photopolym. Sci. & Tech., 1992, 5 (1), 111). These reagents, however, are toxic and expensive and not fully effective for promoting photodecomposition reaction.

There is also a strong desire to increase the photo decomposition rate of polysilanes.

Color filters used in optical and lighting apparatus are generally manufactured by dyeing, printing, pigment dispersing and electrodepositing techniques.

The dyeing technique is by coating to a surface of a glass substrate a high molecular weight material having a photosensitive dichromate added thereto, exposing the coating through a mask, developing to form a desired pattern of film, dyeing the film with a dye, and coating an anti-stain layer on the film. This procedure is repeated plural times until a desired color filter is obtained. The dyeing technique is successful in producing color filters having a high degree of completeness, but has the disadvantages of a complex series of steps and an increased cost.

The printing techniques including stencil printing, offset printing, and gravure printing techniques are simple in manufacturing color filters, but suffer from precision and stability.

The pigment dispersing technique, also known as a color resist technique, is to prepare a color filter by repeating the step of patterning a coloring dispersion of a pigment by photo-lithography. The resulting color filter is well resistant against heat and light while the technique is complex in process and disadvantageous in cost.

A method of preparing a color filter using polysilane film was proposed as a solution to the above-mentioned problems of the prior art color filter manufacturing techniques. It was found that when polysilane film is exposed to ultraviolet radiation and immersed in an aqueous solution of a cationic dye, only the exposed portion is dyed and that a single film is subject to multi-color pattern dyeing (see Yokoyama et al., the 63th Spring Annual Meeting of the Japanese Chemical Society, 4F8 08). With this method, color filters can be prepared through simple steps and hence, at low cost.

This color filter preparation method is simple as compared to the conventional ones, but still suffers from problems including a long exposure time and low mechanical strength of polysilane film.

SUMMARY OF THE INVENTION

We have found that the mechanical and photo-decomposition properties of polysilanes can be improved by adding plasticizers thereto. Products having high strength, improved brittleness and cracking resistance under distortion can be shaped therefrom without accompanying any particular reaction. Then a polysilane composition blended with a plasticizer is easy to handle, convenient to shape into products suitable for various applications, and thus satisfactory for practical use. Featuring a significantly improved rate of photo decomposition, the polysilane composition even in a solid state can be decomposed with a minimal quantity of light in a safe and economical manner. Therefore the polysilane composition can find use in lithographic application by utilizing a difference in nature between the polysilane and its photo-decomposed product.

In particular, there is obtained a dyed polysilane film by dissolving in an organic solvent a dyeable polysilane composition comprising a polysilane having the general formula (3):

$$[(R^1R^2Si)_n(R^3R^4Si)_m]_p \qquad \ldots (3)$$

wherein $R^1$, $R^2$, $R^3$ and $R^4$ are independently selected from the group consisting of substituted or unsubstituted alkyl radicals having 1 to 12 carbon atoms and substituted or unsubstituted aryl radicals, letters n, m, and p are positive numbers satisfying $0 \leq n \leq 10$, $0 \leq m \leq 10$, $n+m \leq 10$, and p≧1, and an ester compound, applying the solution to a substrate surface, drying the coating to form a polysilane film, exposing a selected portion of the polysilane film to ultraviolet radiation, and dyeing the exposed portion with a cationic dye. Since the polysilane film is efficiently dyed even when exposed to a reduced dose of ultraviolet radiation, the exposure step is complete within a short time. The dyed polysilane film has improved mechanical strength and is suitable for use as a color filter.

Therefore, the present invention in a first aspect provides a polysilane composition comprising a polysilane compound and a plasticizer.

In a second aspect, the invention provides a dyeable polysilane composition comprising a polysilane of formula (3) and an ester compound.

In a third aspect, the inventive method for preparing a dyed polysilane film includes the steps of applying a solution of the composition to a substrate surface to form a polysilane film, exposing a selected portion of the polysilane film to ultraviolet radiation, and dyeing the exposed portion with a cationic dye.

DETAILED DESCRIPTION OF THE INVENTION

Figure 1:
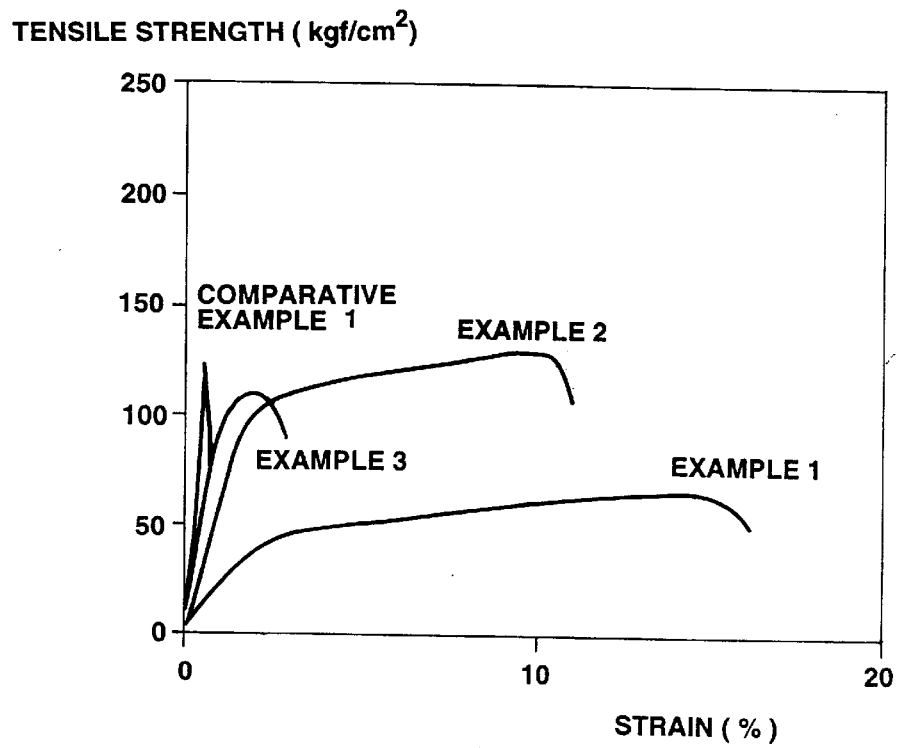
FIG. 1 is a stress-strain curve graph showing the results of a tensile strength test on the polysilane thin films obtained in Examples 1–3 and Comparative Example 1.

The polysilane composition of the present invention is based on a polysilane compound which is preferably selected from polysilane polymers of the general formula (1) and polysilane copolymers of the general formula (2).

In formulae (1) and (2), each of $R^1$, $R^2$, $R^3$ and $R^4$, which may be identical or different, is a hydrogen atom or a monovalent hydrocarbon radical, letter n is an integer of at least 2, and m is an integer of at least 1. Preferably, each of $R^1$, $R^2$, $R^3$ and $R^4$, is a hydrogen atom or a monovalent hydrocarbon radical having 1 to 12 carbon atoms, for example, a hydrogen atom, an alkyl radical such as methyl, ethyl, propyl and hexyl, an aryl radical such as phenyl and alkyl-substituted phenyl, an aralkyl radical such as benzyl and phenethyl, and a cycloalkyl radical such as cyclohexyl.

Preferably the polysilane compound has a weight average molecular weight of at least 10,000, especially at least 50,000. Polysilane compounds having a weight average molecular weight of less than 10,000 would be greasy and difficult to shape. Also the polysilane compound is preferably soluble in solvents because it is often formulated into a composition so that it may be shaped into thin film. The polysilane compound is readily manufactured by a Wurtz condensation method using an alkali metal catalyst.

When it is desired to provide a dyeable polysilane composition, a polysilane having the general formula (3) is used.

In formula (3), each of $R^1$, $R^2$, $R^3$ and $R^4$, which may be identical or different, is selected from the group consisting of substituted or unsubstituted alkyl radicals having 1 to 12 carbon atoms and substituted or unsubstituted aryl radicals. Exemplary alkyl radicals include methyl, ethyl, propyl, butyl and hexyl radicals. Exemplary aryl radicals include phenyl and tolyl radicals and substituted aryl radicals in which some or all of the hydrogen atoms are replaced by alkyl, alkoxy or similar radicals. Letters n, m, and p are positive numbers satisfying $0 \leq n \leq 10$, $0 \leq m \leq 10$, $n+m \geq 10$, and $p \geq 1$.

In the first aspect, a plasticizer is added to the polysilane. A choice may be made among conventional well-known plasticizers commonly used for resins in accordance with a particular application. Exemplary plasticizers include aromatic carboxylate esters, typically phthalate esters such as dibutyl phthalate and dioctyl phthalate;

fatty acid esters such as butyl oleate and dioctyl adipate;

esters of polyhydric alcohols such as diethylene glycol dibenzoate and pentaerythritol esters;

phosphate esters such as trioctyl phosphate and tricresyl phosphate;

epoxy plasticizers such as octyl epoxy stearate;

aliphatic compounds such as paraffin and chlorinated paraffins;

alkyl-substituted aromatic compounds such as alkylbenzenes, alkyl-substituted biphenyls, alkyl-substituted terphenyls and alkyl-substituted naphthalenes; and anionic, cationic and nonionic surfactants.

Preferred among these are carboxylate esters of the following general formulae (4), (5) and (6).

$$R^5-COO-R^6 \quad (4)$$

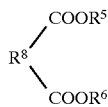
(5)

$$\begin{array}{l} CH_2-COO-R^5 \\ | \\ CH-COO-R^6 \\ | \\ CH_2-COO-R^7 \end{array} \quad (6)$$

In the formulae, $R^5$, $R^6$, and $R^7$ are monovalent hydrocarbon radicals having 1 to 20 carbon atoms, and $R^8$ is a divalent hydrocarbon radical having 1 to 20 carbon atoms.

The plasticizers may be used alone or in admixture of two or more if desired in a particular application where processability, insulation, water resistance, low-temperature resistance, heat resistance, or retention is required.

Desirably about 1 to 200 parts, especially 10 to 100 parts by weight of the plasticizer is added to 100 parts by weight of the polysilane compound in most cases although the amount of plasticizer added varies with a particular type and purpose. Less than 1 part of the plasticizer on this basis would be ineffective for improving mechanical properties or improving a photo-decomposition rate whereas it would be difficult to well retain more than 200 parts of the plasticizer. A particular type of plasticizer, when added in excess, can detract from the transparency of a molded product.

The polysilane and plasticizer are mixed by blending them followed by mechanical milling. The composition is often formed into an article of any desired shape.

For more uniform mixing, the polysilane and plasticizer are dissolved in a common solvent whereby they are mixed. The solution is then shaped while evaporating the solvent. Alternatively the solution is concentrated into a viscous liquid which is shaped while removing the residual solvent. The solvents used herein include aromatic hydrocarbons such as benzene, toluene, and xylene and ether solvents such as tetrahydrofuran and butyl ether.

Where it is desired to use the polysilane composition as optical functional material, the composition is generally shaped to a thin film form which is exposed to light. The light source used for light exposure is preferably one capable of emitting light at the absorption wavelength of the polysilane, typically light in the near-ultraviolet region of 300 to 400 nm. The dose is a quantity of light corresponding to a desired degree of decomposition. In general, for lithography and similar applications, light exposure should be continued until a significant difference in performance develops between exposed and masked zones. A difference in solubility is utilized most often, and in such cases, there is used a solvent which is a poor solvent to the polysilane, but a good solvent to oxidized, decomposed products of siloxane system resulting from photo decomposition, for example, alcohol and ketone solvents.

The polysilane composition of the first aspect can be shaped into a transparent article having excellent mechanical properties, especially high strength and minimal brittleness. The article is resistant to cracking and rupture, easy to handle, and suitable for various purposes. Since the polysilane in solid state is characterized by a high photo decomposition rate and excellent photo decomposition properties, the composition can be used in a wide variety of applications including a lithographic application which takes advantage of a difference in nature between the polysilane and its photo decomposed product.

In the second aspect where it is desired to obtain a dyeable polysilane composition, an ester compound is added to the polysilane, typically of formula (3). The esters used herein include phthalate esters, aromatic carboxylate esters, fatty acid esters, polyhydric alcohol esters and phosphate esters. Desirably about 1 to 100 parts, especially 30 to 40 parts by weight of the ester is added to 100 parts by weight of the polysilane compound.

A dyed polysilane film can be prepared from the dyeable polysilane composition comprising a polysilane of formula (3) and an ester compound by first dissolving the composition in an organic solvent, applying the solution onto a transparent substrate of glass or the like, followed by drying. The organic solvent used herein may be toluene, xylene or the like. The polysilane composition is preferably dissolved in the organic solvent in a concentration of 1 to 30% by weight. The solution is applied to the substrate by any conventional coating technique such as spin coating. Typically the polysilane film after drying has a thickness of 0.5 to 20 μm where it is intended for color filter use.

Next, the polysilane film is exposed to ultraviolet radiation. If desired, pattern exposure is carried out using an appropriate mask pattern. The UV dose is preferably 0.1 to 10 J/cm$^2$, especially 3 to 5 J/cm$^2$. The polysilane film is then immersed in an acetonitrile aqueous solution of a cationic dye whereupon a dyed polysilane film pattern is obtained.

The cationic dyes used herein include Rhodamine 6G, Rhodamine B, Safranine T, Brilliant Green, Malachite Green, Crystal Violet, Basic Blue 3, and Indoin Blue. The cationic dyes are preferably dissolved in aqueous solutions of acetonitrile in concentrations of 0.01 to 10% by weight. Typically 100 parts by weight of acetonitrile is mixed with 500 to 2,000 parts by weight of water to form aqueous solutions of acetonitrile.

Often the polysilane film is immersed in an acetonitrile aqueous solution of a cationic dye for about 1 to 10 minutes.

The dyed polysilane film is a useful color filter.

EXAMPLE

Examples of the invention are given below by way of illustration and not by way of limitation.

Reference Example A 1-liter four-necked round flask was equipped with a stirrer, reflux condenser, thermometer and 100- ml volume dropping funnel. Dry nitrogen was passed through the system overnight. The flask was charged with 24.0 grams of metallic sodium and 350 ml of dry dodecane and heated to 175° C. in an oil bath. The dropping funnel was charged with 95.5 grams (0.5 mol) of phenylmethyldichlorosilane, which was added dropwise over 30 minutes to the flask at 175° C.±3° C. After the completion of addition, the flask was maintained at 175° C. for 2 hours and thereafter, cooled down for terminating reaction. In a nitrogen gas stream, the reaction solution was poured on a glass filter. The filter cake was thoroughly washed with n-octane, then with methanol and finally with water, obtaining a crude product. The crude product was dried and dissolved in 1000 ml of toluene. The solution was transferred to a separatory funnel where water washing was repeated. The organic layer was dried over magnesium sulfate and removed of toluene by distillation, obtaining 39.1 grams of crude polysilanes.

The crude polysilanes were dissolved in toluene. With stirring, acetone was added to the solution, from which polysilane was precipitated again. There was obtained 32.4 grams (yield 54%) of polysilane (Polysilane A). It had a weight average molecular weight of 330,000 as measured by GPC. Polysilane A, 10 grams, was precipitated again from a toluene/n-octane system, obtaining 6.4 grams of high molecular weight polysilane (Polysilane B) having a weight average molecular weight of 580,000. By concentrating the filtrate and adding octane thereto, there was obtained low molecular weight polysilane (Polysilane C) having a weight average molecular weight of 53,000. Polysilanes A, B and C had the following structure.

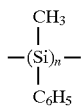

The following examples demonstrate the first aspect using plasticizers.

Examples 1–3 & Comparative Example 1

In 2 ml of toluene were dissolved 100 mg of Polysilane A obtained in Reference Example and 50 mg of bis(2-ethylhexyl) phthalate. The solution was coated onto a glass plate by means of an applicator, dried at 60° C. for one hour, and further dried in vacuum at 60° C. for one hour, obtaining a polysilane thin film of about 42 μm thick. This thin film (Example 1) was transparent and flexible and did not crack as opposed to an otherwise identical polysilane thin film having no bis(2- ethylhexyl) phthalate added thereto.

Thin films were similarly prepared while varying the amount of bis(2- ethylhexyl) phthalate added as shown in Table 1. Specimens of 5 mm×40 mm were cut therefrom and subjected to a tensile strength test. Table 1 reports the tensile strength (TS), modulus of elasticity (Modulus) and elongation at breakage (El). Stress-strain curves are plotted in FIG. 1. It is to be noted that the tensile strength test used a tensile tester model VTM-II-20 (manufactured by Toyo Baldwin K.K.) at a cross head speed of 20 mm/min.

TABLE 1

|  |  | Polysilane (A) | Bis(2-ethylhexyl) phthalate (mg) | Thickness (μm) | TS (kgf/mm²) | Modulus (kgf/mm²) | El (%) |
|---|---|---|---|---|---|---|---|
| Example | 1 | 100 | 50 | 42 | 70 | 3040 | 16 |
|  | 2 | 100 | 30 | 40 | 139 | 8500 | 10 |
|  | 3 | 100 | 20 | 39 | 114 | 9040 | 1.9 |
| Comparative Example 1 |  | 100 | 0 | 38 | 129 | 20800 | 0.72 |

As seen from Table 1 and FIG. 1, although plasticizer-free polysilane is a very brittle material, polysilane thin films having bis(2-ethylhexyl) phthalate added thereto are tough ductile materials having satisfactory strength.

Examples 4–7 & Comparative Example 2

As in Example 1, thin films were prepared by adding 30 mg of the plasticizers shown in Table 2 to 100 mg of Polysilane A and measured for mechanical properties. The results are shown in Table 2 and FIG. 2.

TABLE 2

|  |  | Plasticizer | Amount (mg) | Thickness (μm) | TS (kgf/mm²) | Modulus (kgf/mm²) | El (%) |
|---|---|---|---|---|---|---|---|
| Example | 4 | tricresyl phosphate | 30 | 42 | 203 | 10900 | 6.2 |
|  | 5 | diethylene glycol dibenzoate | 30 | 40 | 178 | 8600 | 6.7 |
|  | 6 | n-butyl oleate | 30 | 39 | 124 | 6000 | 14 |

TABLE 2-continued

|  |  | Plasticizer | Amount (mg) | Thickness (μm) | TS (kgf/mm²) | Modulus (kgf/mm²) | El (%) |
|---|---|---|---|---|---|---|---|
|  | 7 | bis(2-ethylhexyl) phthalate | 30 | 41 | 139 | 8500 | 10 |
| Comparative Example 2 |  | none | 0 | 38 | 129 | 20800 | 0.72 |

Figure 2:
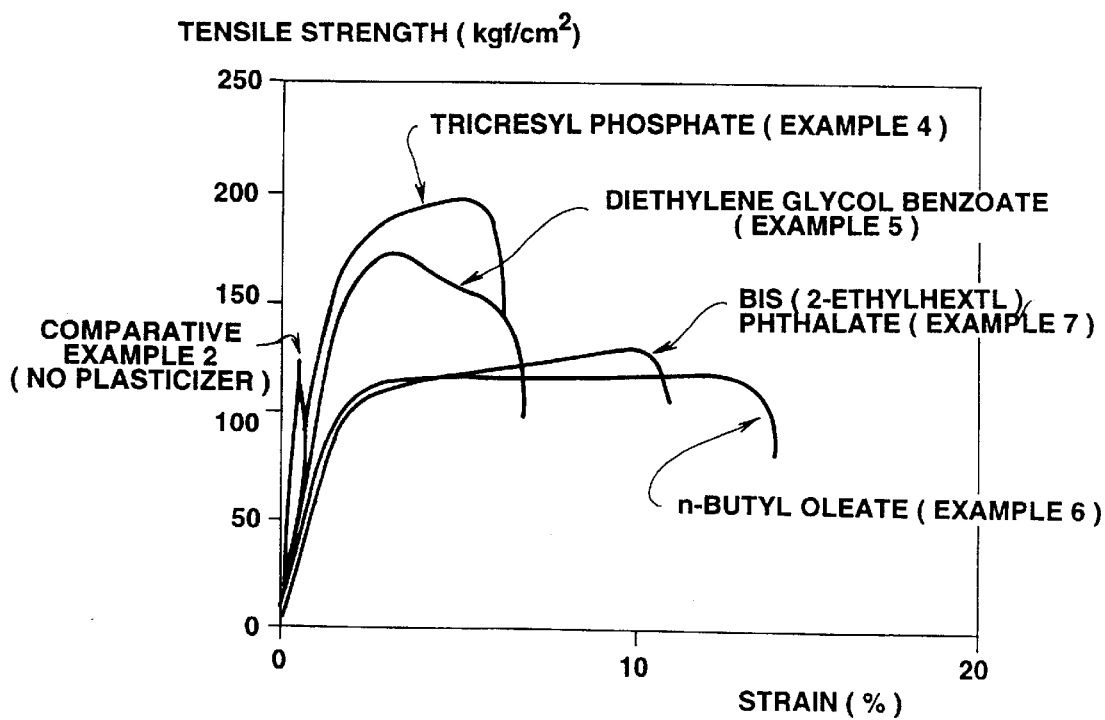
FIG. 2 is a stress-strain curve graph showing the results of a tensile strength test on the polysilane thin films obtained in Examples 4–7 and Comparative Example 2.

As seen from Table 2 and FIG. 2, addition of plasticizers is effective for increasing tensile strength and elongation at breakage, indicating that polysilane is significantly improved in brittleness.

Examples 8–10% Comparative Example 3

Thin films were prepared by the same procedure as in Example 1 except that aromatic compounds were used as the plasticizer. The same tensile test was carried out. The results are showing in Table 3.

TABLE 3

|  |  | Plasticizer | Amount (mg) | Thickness (μm) | TS (kgf/mm²) | Modulus (kgf/mm²) | El (%) |
|---|---|---|---|---|---|---|---|
| Example | 8 | 4-ethyl-biphenyl | 30 | 41 | 161 | 17100 | 1.5 |
|  | 9 | 2-phenyl-toluene | 30 | 41 | 197 | 9200 | 3.6 |
|  | 10 | 3,3'-dimethyl-biphenyl | 30 | 40 | 137 | 6800 | 2.2 |
| Comparative Example 3 |  | none | 0 | 38 | 129 | 20800 | 0.72 |

As seen from Table 3, the aromatic plasticizers contribute to increased tensile strength though they are relatively less effective for improving elongation at breakage.

Examples 11–12

Thin films were similarly prepared by adding 30 mg of bis(2-ethylhexyl) phthalate to Polysilanes B and C. The same tensile test was carried out. The results are shown in Table 4.

TABLE 4

|  |  | Polysilane (mg) | Plasticizer amount (mg) | Thickness (μm) | TS (kgf/mm²) | Modulus (kgf/mm²) | El (%) |
|---|---|---|---|---|---|---|---|
| Example | 11 | Polysilane B 100 | 30 | 40 | 165 | 8900 | 15 |
|  | 12 | Polysilane C 100 | 30 | 41 | 52 | 2080 | 35 |

As seen from Table 4, the polysilane compositions within the scope of the invention provide shaped articles with improved mechanical strength.

Example 13

In 500 mg of toluene were dissolved 20 mg of polysilane obtained in Reference Example and 10 mg of bis(2-ethylhexyl) adipate. The solution was coated onto a quartz glass plate by means of a spin coater and dried in vacuum at 40° C. for one hour, obtaining a polysilane thin film of about 0.4 μm.

Figure 3:
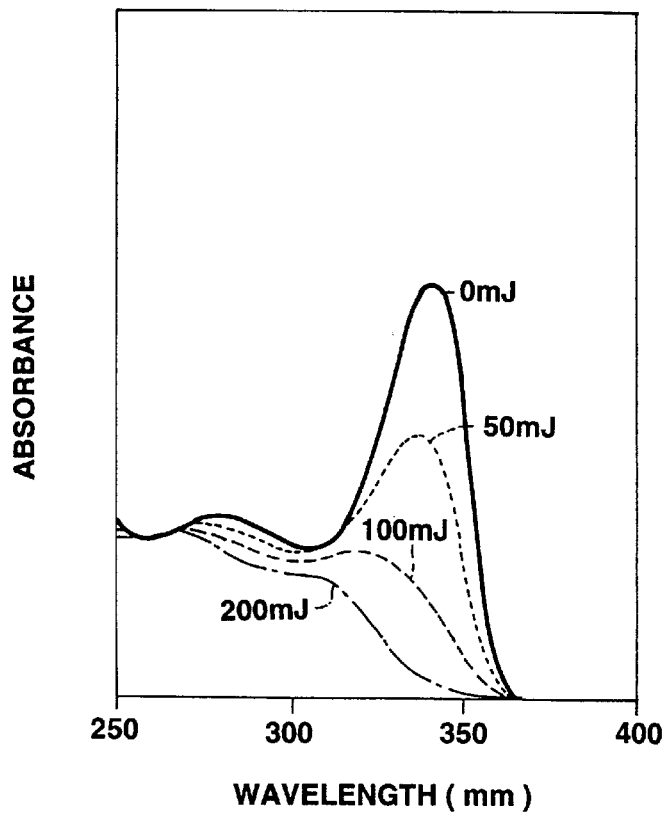
FIG. 3 is a graph showing spectral changes by light exposure of the polysilane thin film obtained in Example 13 as measured by a UV spectrophotometer.

Using a xenon lamp irradiation apparatus, the film was exposed to light which was transmitted by 5 cm of an aqueous solution of 100 g/l nickel sulfate hexahydrate, 1 cm of an isooctane solution of 12.8 g/l naphthalene, and a Corning filter CS7-51 from the light source (the transmitted light having a wavelength range of 320 to 360 centering at 334 nm). The degree of photo decomposition was monitored at intervals using a UV spectrophotometer. The results are shown in Table 5. The spectral changes are shown in FIG. 3. The light quantity was 0.044 mW/cm$^2$ as measured by a UV intensity meter.

TABLE 5

| Exposure time | Dose (mJ) | λ max (nm) | Light absorbance | Change of absorbance* (%) |
|---|---|---|---|---|
| 0" | 0 | 341 | 3.49 | 100 |
| 18'56" | 50 | 338 | 2.16 | 62 |
| 37'53" | 100 | 320 | 1.21 | 35 |
| 75'45" | 200 | 310 | 0.96 | 28 |

*The ratio of light absorbance to initial light absorbance in percents.

Figure 4:
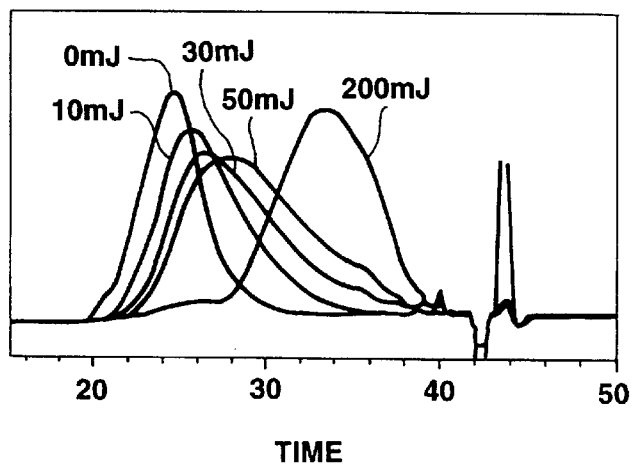
FIG. 4 is a gel permeation chromatogram of the polysilane thin film obtained in Example 13 after light exposure.

Measurements by gel permeation chromatography (GPC) are shown in Table 6 and changing chromatograms are shown in FIG. 4

TABLE 6

| Exposure time | Dose (mJ) | Number average molecular weight (Mn, × 10$^3$) | Weight average molecular weight (Mw, × 10$^3$) |
|---|---|---|---|
| 0" | 0 | 88.0 | 329 |
| 3'47" | 10 | 25.2 | 109 |
| 7'35" | 30 | 13.2 | 64.9 |
| 18'56" | 50 | 7.63 | 44.3 |
| 75'45" | 200 | 2.45 | 10.5 |

Comparative Example 4

Figure 5:
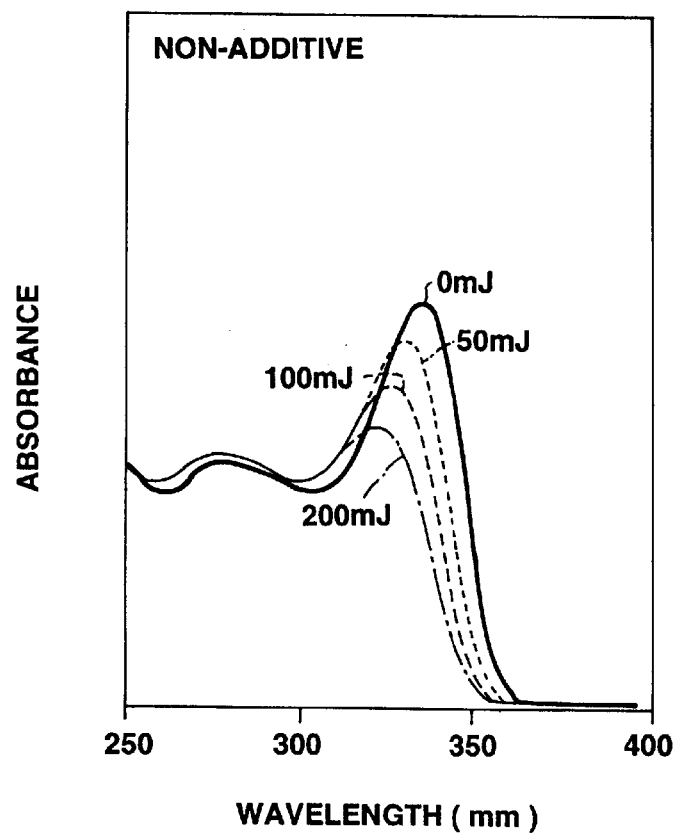
FIG. 5 is a graph showing spectral changes by light exposure of the polysilane thin film obtained in Comparative Example 4 as measured by a UV spectrophotometer.
Figure 6:
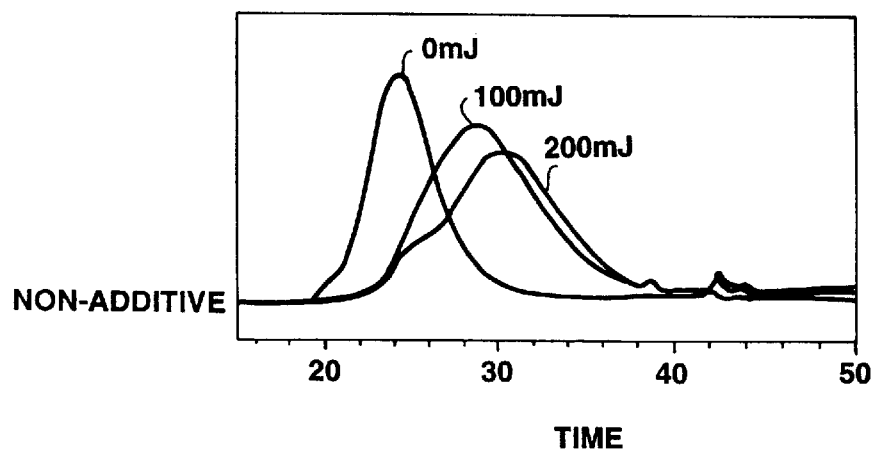
FIG. 6 is a gel permeation chromatogram of the polysilane thin film obtained in Comparative Example 4 after light exposure.

A polysilane thin film was prepared as in Example 13 without adding bis(2-ethylhexyl) adipate, and exposed to light. The spectral and GPC results are shown in Tables 7 and 8, and the spectral and chromatographic changes are shown in FIGS. 5 and 6.

TABLE 7

| Dose (mJ) | λ max (nm) | Light absorbance | Change of absorbance* (%) |
|---|---|---|---|
| 0 | 335 | 3.27 | 100 |
| 50 | 331 | 2.96 | 91 |
| 100 | 327 | 2.59 | 79 |
| 200 | 322 | 2.26 | 69 |

*The ratio of light absorbance to initial light absorbance in percents.

TABLE 8

| Dose (mJ) | Number average molecular weight (Mn, ×10$^3$) | Weight average molecular weight (Mw, × 10$^3$) |
|---|---|---|
| 0 | 88.0 | 329 |
| 100 | 8.14 | 59.9 |
| 200 | 6.08 | 44.1 |

As seen from Tables 5–8 and FIGS. 3–6, the polysilane having bis(2-ethylhexyl) adipate added, Example 13, has a high photo decomposition rate indicating the effectiveness of the plasticizer.

Figure 7:
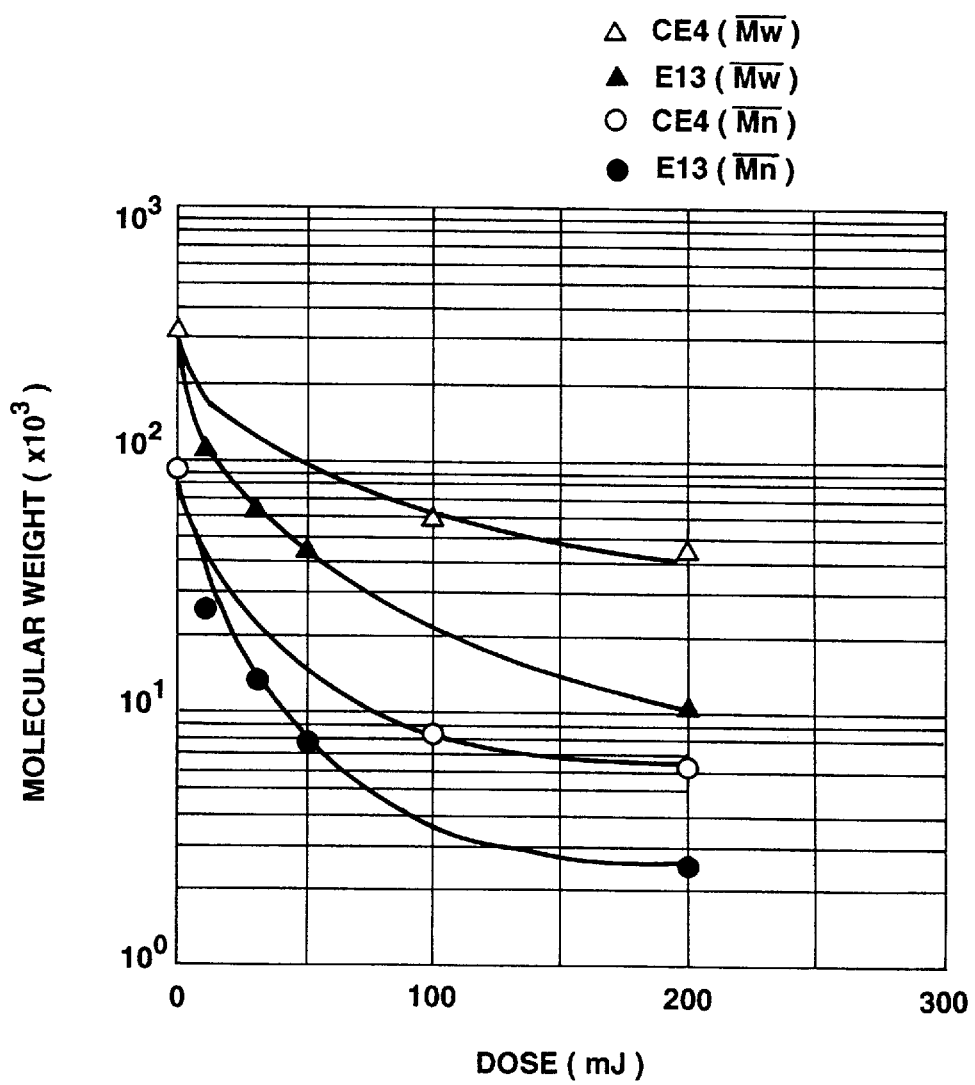
FIG. 7 is a graph showing the molecular weight versus light dose of the polysilane thin films obtained in Example 13 and Comparative Example 4 as measured by gel permeation chromatography.

FIG. 7 is a graph showing how the polysilane thin films of Example 13 and Comparative Example 4 vary their molecular weight as measured by GPC.

Examples 14–15

Polysilane thin films were prepared as in Example 13 while adding 4 mg and 6 mg of bis(2-ethylhexyl) adipate, and exposed to light for decomposition. The results are shown in Table 9.

TABLE 9

| | Dose (mJ) | λ max (nm) | Light absorbance | Change of absorbance* (%) |
|---|---|---|---|---|
| Example 14 | 0 | 340 | 3.26 | 100 |
| | 50 | 336 | 2.43 | 75 |
| | 100 | 332 | 1.80 | 55 |
| | 200 | 322 | 1.37 | 42 |
| Example 15 | 0 | 340 | 3.34 | 100 |
| | 100 | 328 | 1.53 | 46 |
| | 200 | 311 | 1.19 | 36 |

*The ratio of light absorbance to initial light absorbance in percents.

Figure 8:
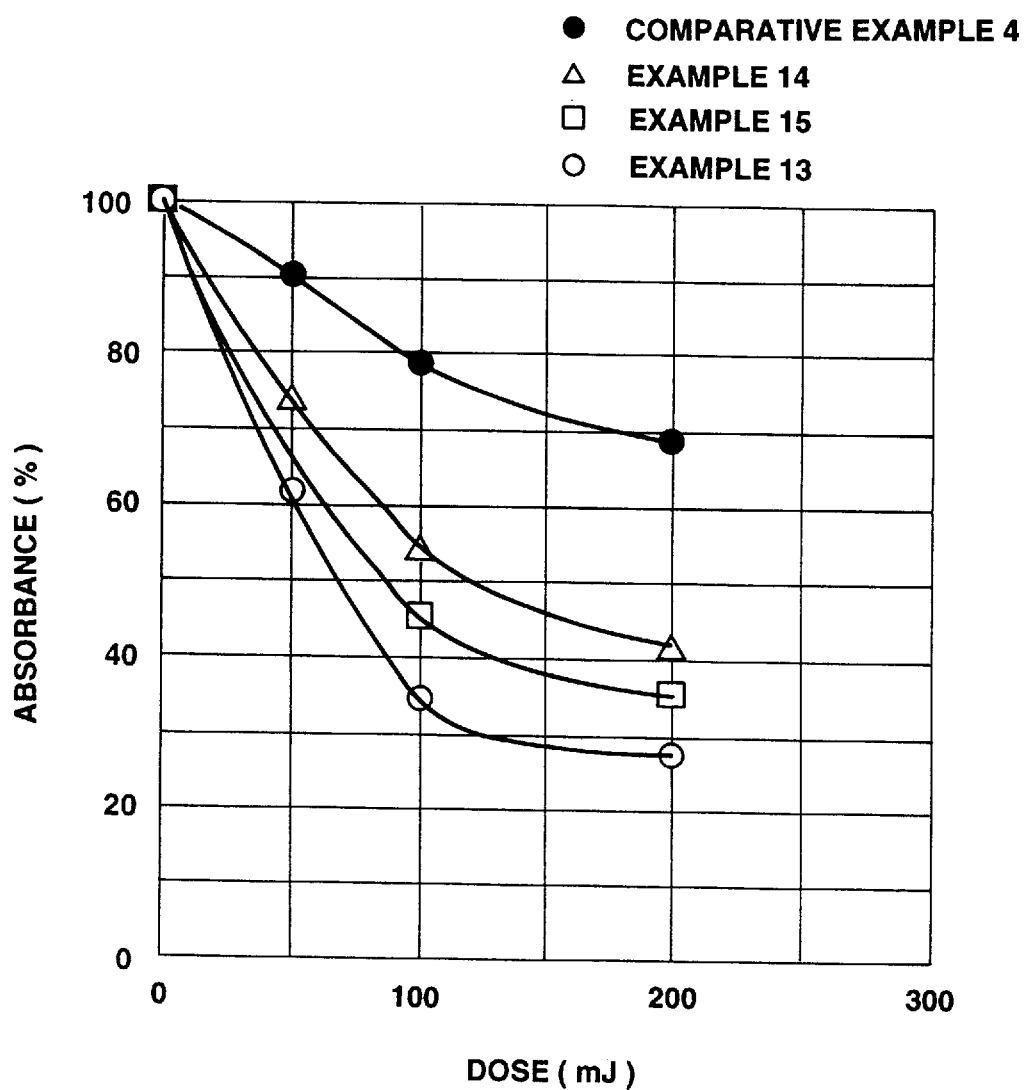
FIG. 8 is a graph showing the light absorbance versus light dose of the polysilane thin films obtained in Examples 13–15 and Comparative Example 4.

The results of Examples 13–15 and Comparative Example 4 are plotted together to give FIG. 8 which is a graph showing how the light absorbance lowers with the light dose. There is observed the tendency that the ratio of light absorbance to initial light absorbance drastically drops as the amount of bis(2-ethylhexyl) adipate added is increased.

Examples 16–18

Figure 9:
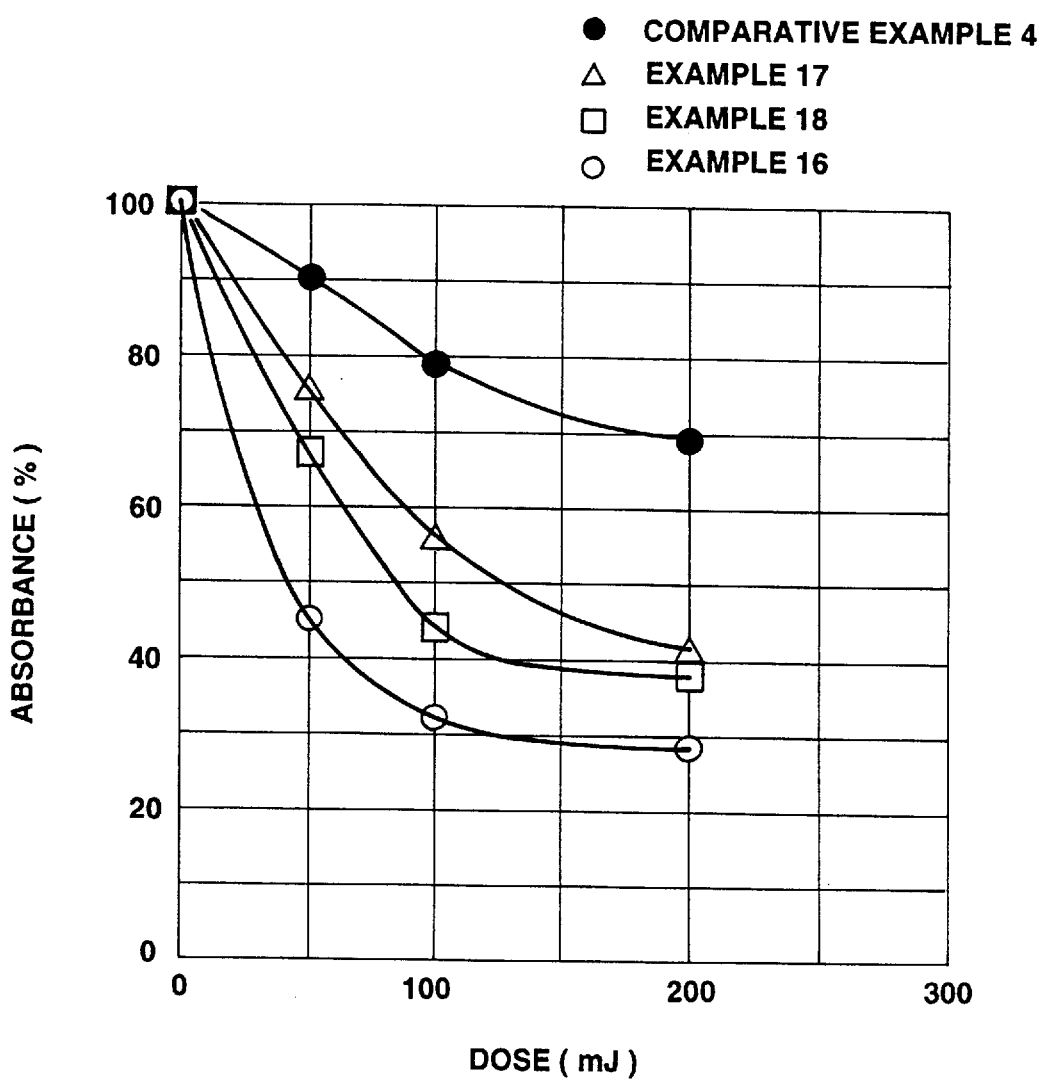
FIG. 9 is a graph showing the light absorbance versus light dose of the polysilane thin films obtained in Examples 16–18 and Comparative Example 4.

Polysilane thin films were prepared as in Examples 13–15 except that bis(2-ethylhexyl) adipate was replaced by butyl oleate, and exposed to light for decomposition. The results are equivalent to those corresponding to bis(2-ethylhexyl) adipate. The results are shown in FIG. 9.

Comparative Example 5

Polysilane thin films were prepared as in Example 15 except that hexachloro-p-xylene was used, and exposed to light for decomposition. The results are shown in Table 10.

TABLE 10

| Dose (mJ) | λ max (nm) | Light absorbance | Change of absorbance* (%) |
|---|---|---|---|
| 0 | 340 | 2.25 | 100 |
| 10 | 339 | 2.15 | 96 |
| 30 | 337 | 1.99 | 88 |
| 50 | 336 | 1.84 | 82 |
| 100 | 335 | 1.42 | 63 |
| 200 | 326 | 0.80 | 36 |

*The ratio of light absorbance to initial light absorbance in percents.

Figure 10:
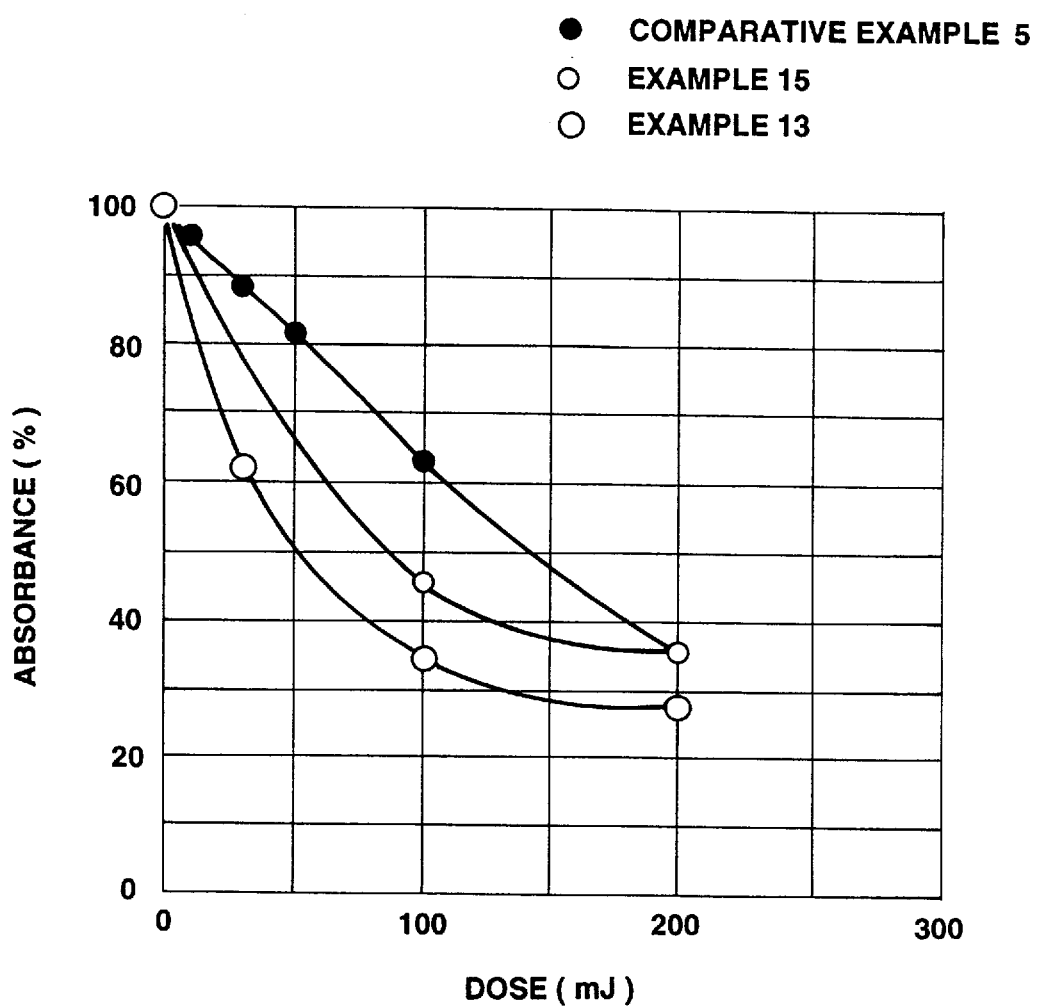
FIG. 10 is a graph showing the light absorbance versus light dose of the polysilane thin films obtained in Examples 13, 15 and Comparative Example 5.

The results of Examples 13, 15 and Comparative Example 5 are plotted together to give FIG. 10 which is a graph showing how the light absorbance lowers with the light dose. It is seen that the addition of bis(2-ethylhexyl) adipate is more effective for accelerating photo decomposition than hexachloro-p-xylene.

Examples 19–26

Figure 11:
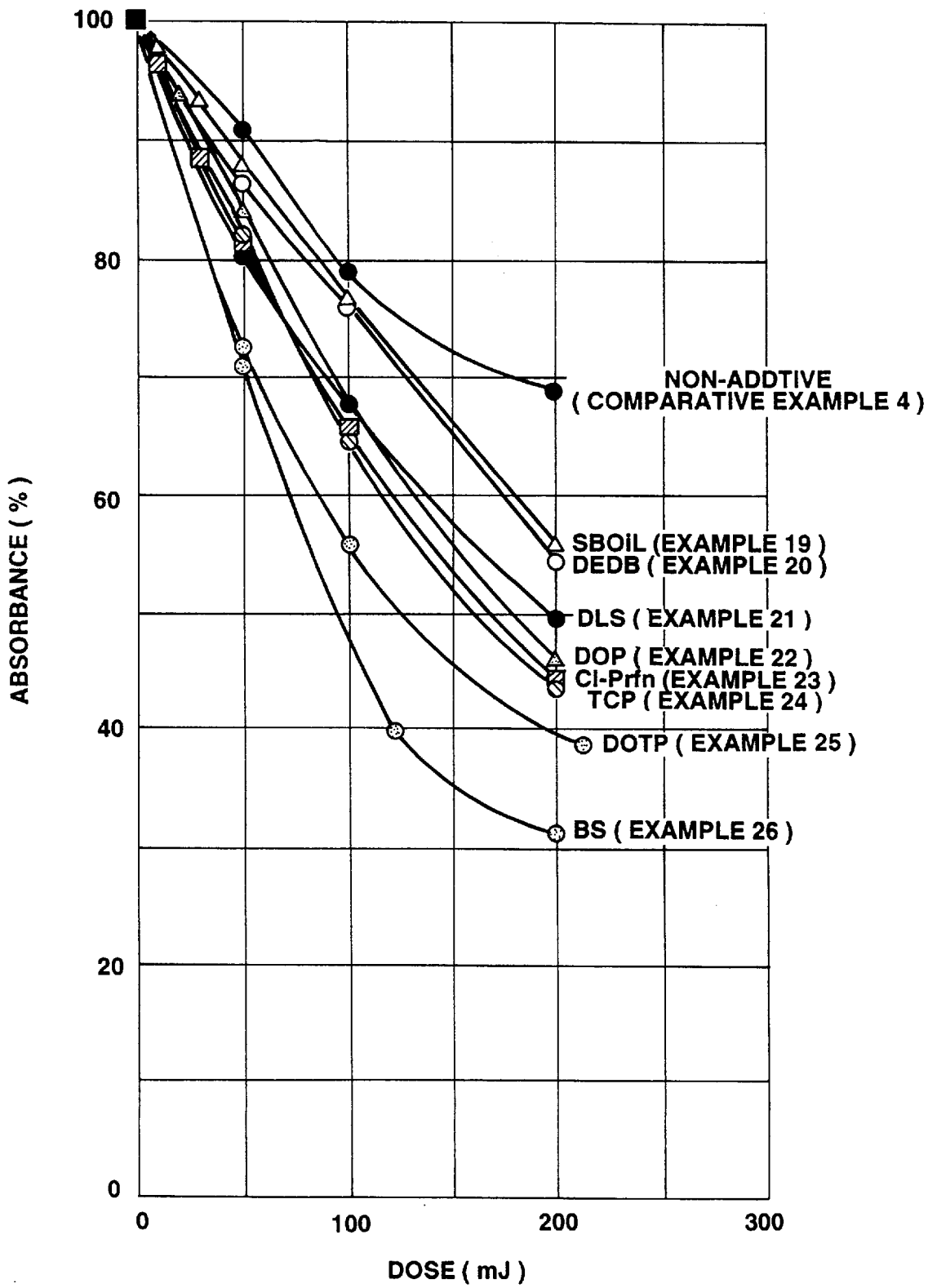
FIG. 11 is a graph showing the light absorbance versus light dose of the polysilane thin films obtained in Examples 19–26 and Comparative Example 4.

Polysilane thin films were prepared as in Example 13 except that 50 parts by weight of eight typical plasticizers as shown below were added, and exposed to light for decomposition. All the plasticizers accelerated photo decomposition as compared with Comparative Example 4 though they were effective to a more or less extent. The ratio of light absorbance to initial one is shown in FIG. 11.

| Example | Abbreviation | Plasticizer |
|---------|--------------|-------------|
| 19 | SB Oil | soy bean oil |
| 20 | DEDB | diethylene glycol dibenzoate |
| 21 | DLS | dilauryl succinate |
| 22 | DOP | dioctyl phthalate |
| 23 | Cl-Prfn | chlorinated paraffin (chlorination about 40%) |
| 24 | TCP | tricresyl phosphate |
| 25 | DOTP | dioctyl tetrahydrophthalate |
| 26 | BS | butyl stearate |

The following examples demonstrate the second aspect using esters. All parts are by weight.

Example 27

A polysilane solution was prepared by mixing 100 parts of methylphenylpolysilane: $(CH_3C_6H_5Si)_n$ and 30 parts of n-butyl oleate and dissolving the mixture in toluene to a concentration of 20% by weight. The solution was spin coated onto a quartz substrate and dried in vacuum, obtaining a polysilane film of about 3 μm thick. Using a high pressure mercury lamp, the film was exposed to UV in a dose of 3 J/cm². The film was then immersed in an acetonitrile aqueous solution of 0.1% by weight Rhodamine B (acetonitrile/water=100/10) for 10 minutes, obtaining a dyed polysilane film.

The dyed film was measured for visible light absorption spectrum to find a transmittance of 0.06% attributable to the characteristic absorption (556 nm) of the dye, indicating that the polysilane film had been fully dyed.

Example 28

A dyed polysilane film was prepared by the same procedure as in Example 27 except that the ester used was diethylene glycol dibenzoate. The dyed film was measured for visible light absorption spectrum to find a transmittance of 0.06% attributable to the characteristic absorption (556 nm) of the dye, indicating that the polysilane film had been fully dyed.

Comparative Example 6

A dyed polysilane film was prepared by the same procedure as in Example 27 except that the ester was omitted (UV dose 3 J/cm²). The dyed film was measured for visible light absorption spectrum to find a transmittance of 28% attributable to the characteristic absorption (556 nm) of the dye, indicating an insufficient degree of dyeing.

Example 29

There were furnished samples by using diethylene glycol dibenzoate as the ester and varying the amount of ester to 10, 20, 30, 40 and 50 parts per 100 parts of polysilane. From these samples, dyed polysilane films were obtained by exposing them to UV in a dose of 3 J/cm² under a high pressure mercury lamp and then immersing in a dye solution. The transmittance (556 nm) of the dye was 0.60%, 0.24%, 0.06%, 0.12%, and 0.30%, all indicating full dyeing.

Example 30

A polysilane film was prepared by the same procedure as in Example 27 except that the ester used was di(ethylhexyl) adipate. Using a lattice pattern mask having a line width of 20 μm, the film was subject to pattern exposure under the same irradiation conditions as in Example 27. The resulting polysilane film pattern was dyed as in Example 27. A definite dyed pattern was obtained.

Where a dyeable polysilane composition according to the invention is used to form a dyed polysilane film, there are many advantages that the exposure step can be complete within a short time since the polysilane film is efficiently dyed even with a reduced light dose, and that the resulting dyed film has good mechanical strength. The dyed polysilane film is thus a useful color filter.

Although some preferred embodiments have been described, many modifications and variations may be made thereto in the light of the above teachings. It is therefore to be understood that within the scope of the appended claims, the invention may be practiced otherwise than as specifically described.

We claim:

1. A method for preparing a dyed polysilane film comprising the steps of:

applying a solution of a polysilane composition comprising a polysilane compound and a carboxylate ester to a surface of a substrate to form a polysilane film, exposing a selected portion of the polysilane film to ultraviolet radiation, and dyeing the exposed portion with a cationic dye, wherein the carboxylate ester has the following formula (4), (5) or (6)

$$R^5-COO-R^6 \tag{4}$$

$$R^8\begin{matrix}COOR^5\\ \\COOR^6\end{matrix} \tag{5}$$

$$\begin{matrix}CH_2-COO-R^5\\ |\\ CH-COO-R^6\\ |\\ CH_2-COO-R^7\end{matrix} \tag{6}$$

wherein $R^5$, $R^6$ and $R^7$ are monovalent hydrocarbon radicals having 1 to 20 carbon atoms; and $R^2$ is a divalent hydrocarbon radical having 1 to 20 carbon atoms.

2. The method for preparing a dyed polysilane film according to claim 1, wherein the polysilane compound has the following formula (3):

$$((R^1R^2Si)_n(R^3R^4Si)_m)_p \tag{3}$$

wherein $R^1$, $R^2$, $R^3$ and $R^4$ are independently selected from the group consisting of substituted or unsubstituted alkyl radicals having 1 to 12 carbon atoms and substituted or unsubstituted aryl radicals; letters n, m and p are positive numbers satisfying $0 \leq n \leq 10$, $0 \leq m \leq 10$, $n+m \geq 10$, and $p \geq 1$.

3. The method for preparing a dyed polysilane film according to claim 2, wherein $R^1$, $R^2$, $R^3$ and $R^4$ are independently selected from the group consisting of methyl, ethyl, propyl, butyl, hexyl, phenyl, tolyl, substituted phenyl and substituted tolyl, where the substituent is an alkyl or alkoxy radical.

4. The method for preparing a dyed polysilane film according to claim 1, wherein the polysilane compound has a weight average molecular weight of at least 10,000.

5. The method for preparing a dyed polysilane film according to claim 1, wherein the polysilane compound has a weight average molecular weight of at least 50,000.

6. The method for preparing a dyed polysilane film according to claim 1, wherein the solution of the polysilane composition comprises 1 to 100 parts by weight of the carboxylate ester per 100 parts by weight of the polysilane compound.

7. The method for preparing a dyed polysilane film according to claim 1, wherein the solution of the polysilane composition comprises 30 to 40 parts by weight of the carboxylate ester per 100 parts by weight of the polysilane compound.

8. The method for preparing a dyed polysilane film according to claim 1, wherein the polysilane compound and carboxylate ester are dissolved in benzene, toluene, xylene, tetrahydrofuran or butyl ether.

9. The method for preparing a dyed polysilane film according to claim 1, wherein 1 to 30% by weight of the polysilane composition is dissolved in an organic solvent to obtain the solution of the polysilane composition.

10. The method for preparing a dyed polysilane film according to claim 1, wherein the polysilane film has a thickness of 0.5 to 20 μm.

11. The method for preparing a dyed polysilane film according to claim 1, wherein the polysilane film is exposed to ultraviolet radiation of 0.1 to 10 $J/cm^2$.

12. The method for preparing a dyed polysilane film according to claim 1, wherein the polysilane film is exposed to ultraviolet radiation of 3 to 5 $J/cm^2$.

13. The method for preparing a dyed polysilane film according to claim 1, wherein the exposed polysilane film is immersed in an acetonitrile aqueous solution of a cationic dye.

14. The method for preparing a dyed polysilane film according to claim 1, wherein the cationic dye is selected from the group consisting of Rhodamine 6G, Rhodamine B, Safranine T, Brilliant Green, Malachite Green, Crystal Violet, Basic Blue 3, and Indoin Blue.

15. The method for preparing a dyed polysilane film according to claim 13, wherein 0.01 to 10% by weight of the cationic dye is dissolved in the aqueous solution of acetonitrile.

* * * * *